US005589792A

United States Patent [19]

Brokaw

[11] Patent Number: 5,589,792

[45] Date of Patent: Dec. 31, 1996

[54] RESISTOR PROGRAMMABLE TEMPERATURE SWITCH

[75] Inventor: A. Paul Brokaw, Burlington, Mass.

[73] Assignee: Analog Devices, Inc., Norwood, Mass.

[21] Appl. No.: 423,828

[22] Filed: Apr. 19, 1995

[51] Int. Cl.$^6$ .............................. H01L 35/00; G05F 1/10; G05F 3/16

[52] U.S. Cl. .......................... 327/512; 327/538; 327/541; 327/576; 323/315

[58] Field of Search .................................... 327/512, 513, 327/538, 539, 540, 541, 482, 576; 323/312, 313, 314, 315

[56] References Cited

U.S. PATENT DOCUMENTS

| | | | |
|---|---|---|---|
| 4,380,706 | 4/1983 | Wrathall | 323/313 |
| 4,633,165 | 12/1986 | Pietkiewicz et al. | 323/314 |
| 4,885,525 | 12/1989 | Gontowski, Jr. | 323/315 |
| 5,394,078 | 2/1995 | Brokaw | 323/313 |

*Primary Examiner*—David C. Nelms
*Assistant Examiner*—Trong Phan
*Attorney, Agent, or Firm*—Iandiorio & Teska

[57] ABSTRACT

A resistor programmable temperature switch for indicating that a preselected trip temperature has been reached includes first and second bipolar trasistors of like polarity having a fixed ratio of emitter areas; means for connecting the emitters of the first and second transistors to a common terminal; first and second current sources for providing first and second predetermined currents to the collector of the first and second transistors, respectively; a third transistor; means connecting its control terminal to the first current source and a first load terminal connected to the base of the first transistor for operating the first transistor to conduct the first predetermined current from the current source; means for interconnecting a second load terminal of the third transistor with a power supply terminal; a resistor network including first and second resistors connected between the base of the first transistor and the common terminal for biasing the base of the second transistor to a fraction of the base emitter voltage of the first transistor; and a fourth transistor; means for connecting the first load terminal of the fourth transistor to the common terminal and means for connecting the control terminal of the fourth transistor to the second current source; the load current of the fourth transistor changing state when the preselected trip temperature has been reached.

6 Claims, 3 Drawing Sheets

RESISTOR PROGRAMMABLE TEMPERATURE SWITCH

FIELD OF INVENTION

A resistor programmable temperature switch for determining that a preselected trip temperature has been reached.

BACKGROUND OF INVENTION

Conventional integrated circuit temperature switches or set point controllers which provide a predetermined output signal when a preset temperature is reached suffer from a number of shortcomings. The temperature set point may vary due to a variety of manufacturing variables such as sheet resistance variations, current density errors, and variations in the transistor base to emitter voltages from lot to lot. In some cases the transistors which determine the set point have their collector-base voltages, subject to the supply voltage so that fluctuations in the supply voltage cause changes to the temperature set point due to the Early effect. In addition, attempts to make such devices easily externally programmable have met with indifferent success because of inability to account for various fabrication variables; some require two or more external resistors for set point programming.

SUMMARY OF INVENTION

It is therefore an object of this invention to provide an improved resistor programmable temperature switch for indicating when a preselected trip temperature has been reached.

It is a further object of this invention to provide such an improved resistor programmable temperature switch which requires but one external programming resistor.

It is a further object of this invention to provide such an improved resistor programmable temperature switch in which the external resistance required is a predictable function of the selected set point temperature.

It is a further object of this invention to provide such an improved resistor programmable temperature switch in which the external resistance to produce a given temperature set point is independent of manufacturing variations.

It is a further object of this invention to provide such an improved resistor programmable temperature switch which operates quickly and abruptly at the chosen temperature set point and is more immune to noise proximate the chosen set point.

It is a further object of this invention to provide such an improved resistor programmable temperature switch which is more insensitive to power supply fluctuations and operates at low supply voltages.

The invention results from the realization that an external resistor programmable temperature switch for indicating when a preselected trip temperature has been reached which switches cleanly and abruptly and in which the external resistance required is a predetermined function of the set point temperature can be achieved by controlling the difference in base to emitter voltages ($\Delta V_{BE}$) using a resistor network which is in part trimmable to correct for manufacturing variations in sheet resistances and base to emitter voltages and is in part adjustable in its external resistor portion to set the trip temperature.

This invention features a resistor programmable temperature switch for indicating that a preselected trip temperature has been reached. There are first and second bipolar transistors of like polarity and having a fixed ratio of emitter areas. There are also means for connecting the emitters of the first and second transistors to a common terminal. First and second current sources provide first and second predetermined currents to the collectors of the first and second transistors, respectively. A third transistor has means connecting its control terminal to the first current source and has a first load terminal connected to the base of the first transistor for operating the first transistor to conduct the first predetermined current from the first current source. There are means for interconnecting a second load terminal of the third transistor with a power supply terminal. A resistor network includes first and second resistors connected between the base of the first transistor and the common terminal for biasing the base of the second transistor to a fraction of the base emitter voltage of the first transistor. There is a fourth transistor, means for connecting a load terminal of the fourth transistor to the common terminal and means for connecting the control terminal of the fourth transistor to the second current source. The load current of the fourth transistor changes state when the preselected temperature has been reached.

In a preferred embodiment, the first resistor may include a first trimmable resistance for correcting for sheet resistance errors and current density errors incurred in manufacturing of the first and second transistors. The second resistor may include a second terminal resistance for correcting for sheet resistance errors and for compensating for manufacturing variations in the base emitter voltages of the first and second transistors. The second resistor may include an adjustable resistance for setting a preselected trip temperature independent of manufacturing variations. There may be further included a third current source for supplying a predetermined load current to the fourth transistor. The means for connecting a load terminal of the fourth transistor to the common terminal may include feedback resistor means for interconnecting both the load terminal of the fourth transistor and the emitter of the second transistor to the common terminals for providing positive feedback for abruptly changing the state of the second transistor for providing noise immunity and hysteresis for abruptly resetting the second transistor. There may be further included a bias resistor interconnecting the emitter of the first transistor to the common terminal for offsetting the emitter voltage of the first transistor.

DISCLOSURE OF PREFERRED EMBODIMENT

Other objects, features and advantages will occur to those skilled in the art from the following description of a preferred embodiment and the accompanying drawings, in which.

Figure 1:
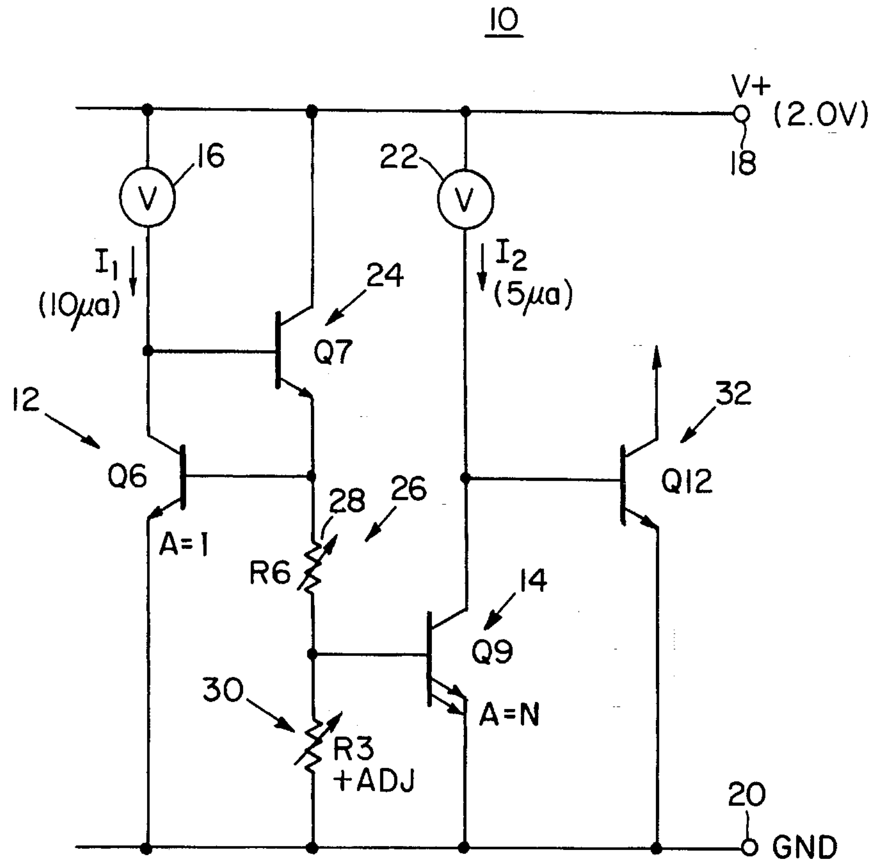
FIG. 1 is a schematic diagram of a resistor programmable temperature switch for indicating when a preselected trip temperature has been reached according to this invention.

There is shown in FIG. 1 a resistor programmable temperature switch 10 according to this invention which includes first and second bipolar transistors 12 and 14 of similar, e.g., NPN, polarity. The collector of transistor 12 is connected to current source 16, typically providing current $I_1$ of 10 microamps at room temperature to voltage supply terminal 18 which can operate at extremely low voltage, as low as 2.0 volts. The emitter of transistor 12 is connected to common terminal 20. Bipolar transistor 14 has an emitter area (A=N) which is N times greater than that of the area (A=I) of transistor 12 in order to establish a preselected current density ratio. The emitter of transistor 14 is connected to common terminal 20 and its collector is connected through a second current source 22 which typically provides a second current $I_2$ of 5 microamps to positive voltage supply terminal 18. While the currents $I_1$ and $I_2$ may vary with temperature somewhat, the ratio of the two currents, in this case 2:1, remains fixed. A third transistor 24 has its base connected to current source 16, its collector to positive power supply terminal 18, and its emitter is connected to the base of transistor 12. Also connected to the base of transistor 12 is voltage divider network 26 which includes a trimming resistance 28 which is trimmed to adjust for variations in the sheet resistance and current density ratio errors. A second resistor 30 is trimmable to compensate for errors in its own sheet resistance as well as other manufacturing variations such as variations in the intrinsic base emitter voltages of transistors 12 and 14. A portion of resistor 30 may be disposed externally for adjusting the set point of the switch independent of manufacturing variations, as can be seen more readily in FIG. 2. A fourth transistor 32 has its emitter interconnected with common terminal 20 and its base interconnected with current source 22. The collector of transistor 32 changes state to provide an indication when the temperature set point has been reached.

In operation, when the switch is operating below the temperature set point, transistor 24 provides a voltage to the base of transistor 12 sufficient to enable transistor 12 to conduct the full or essentially the full current provided by current source 16. In this state voltage divider 26 provides a voltage at the base of transistor 14 which enables it to conduct a portion of the current provided by current source 22, but not all of it. The excess current flows to transistor 32 and as a result the base of output transistor 32 is sufficiently high so that transistor 32 conducts. When the temperature rises to the temperature set point, transistor 14 will conduct all of $I_2$, causing the base of transistor 32 to go low and switch off the signal on the collector of transistor 32. The foregoing explanation of the various current distributions neglects the effects of base currents.

While transistors 24 and 32 are shown as bipolar devices and particularly as NPN transistors, this is not a necessary limitation of the invention as PNP transistors may be used throughout or other types such as FETs can be used for transistors 24 and 32 with suitable modifications known to those skilled in the art.

The operation of circuit 10 can be explained by the fact that the difference in base-to-emitter voltages on transistor 12 and transistor 14, $\Delta V_{BE}$, is equal to:

$$\Delta V_{BE} = \frac{R_{28}}{R_{28}+R_{30}} \left(V_{BE12}\right) \qquad (1)$$

where $\Delta V_{BE}$ is the difference between the base to emitter voltage of transistor 12 and the base to emitter voltage of transistor 14. $R_{28}$ and $R_{30}$ are the resistances of resistors 28 and 30. $V_{BE12}$ is the base to emitter voltage of transistor 12. When the set point temperature is reached, the current through transistor 14 will equal the current $I_2$ provided by current source 22. At that point, the following expression is true:

$$\Delta V_{BE_T} = \frac{kT}{q} \ln\left(N\frac{I_1}{I_2}\right) \qquad (2)$$

where $\Delta V_{BE_T}$ is the difference between the base voltages of transistors 12 and 14, k is Boltzman's constant, T is the temperature in degrees Kelvin q is the charge on an electron, N is the ratio of the emitter area of transistor 14 to that of transistor 12, and $I_1$ and $I_2$ are the currents provided by current sources 16 and 22. When the set point temperature has been reached:

$$\Delta V_{BE} = \Delta V_{BE_T} \qquad (3)$$

and so:

$$\frac{R_{28}}{R_{28}+R_{30}} V_{BE12} = \frac{kT}{1} \ln\left(N\frac{I_1}{I_2}\right) \qquad (4)$$

Equation 4 is only true at and defines the set point. Thus it can be seen that temperature T is a direct function of the resistance $R_{28}$ as well as $R_{30}$.

Figure 2:
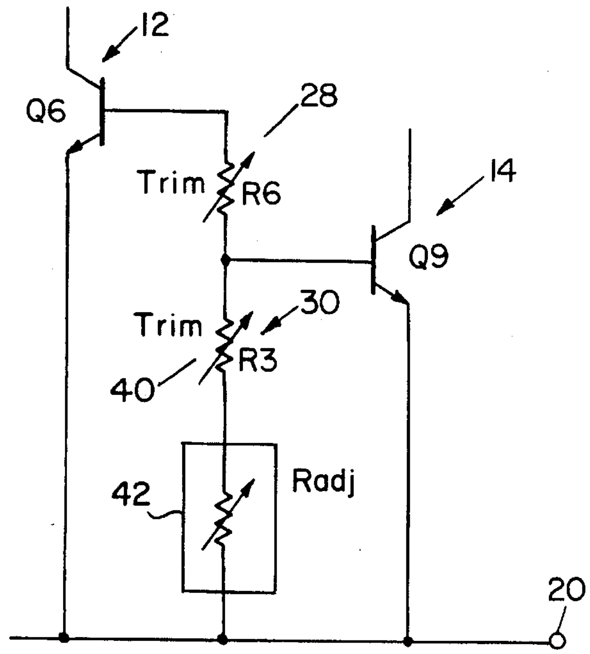
FIG. 2 is a more detailed schematic diagram of a portion of the circuit of the resistor programmable temperature switch of FIG. 1 showing the trimmable and adjustable resistors which control the temperature set point.

In accordance with this invention, resistor 30 may actually include two parts: an adjustable resistor 42, FIG. 2, and trimming resistor 40, which corrects for sheet resistance errors in resistance 40 and compensates for manufacturing variations in the base emitter voltages of transistors 12 and 14. Adjustable resistance 42, on the other hand, sets the preselected trip temperature to which the circuit is set and does so independent of manufacturing variations because these have been trimmed out using resistances 28 and 40. In actual construction, the entire circuit with the exception of adjustable resistance 42, is fabricated as an integrated circuit, while resistance 42 is implemented with an external resistance that can be inserted by the ultimate user in order to choose the particular temperature set point at which the ultimate user desires to have the switch trip. Trimming of resistances 28 and 40 are accomplished in compliance with the following procedures.

The resistance of resistor 28 is selected in accordance with a desired value of the external programming resistor 42. Since the actual resistance of 28 is subject to variation in manufacture, it is made as a trimmable resistor on the IC chip. At any desired trip temperature, in the operating range of the circuit, the nominal voltage across resistor 28 can be calculated using equation (2). Using this voltage together with the desired design center resistance value, the trip temperature current in resistor 28 can be calculated using Ohms law. Using the actual temperature of the device as it is in the trim fixture as the desired trip temperature, it can be argued that for current larger than the calculated value, the actual $\Delta$ Vbe will be greater than the value given by equation (2) so the circuit will not be tripped. That is, transistor 14 will operate at less than $I_2$ so that transistor 32 will be turned on by the excess. When resistor 28 has the correct resistance, reducing the current in resistor 28 to the calculated value should just cause the circuit to trip. That is, transistor 14 will take the last of $I_2$ causing transistor 32 to switch off.

The current in resistor 28 can be controlled by replacing external resistor 42 with an adjustable current source. As this current is swept through a range of values, which includes the value calculated as the trip value for the trim temperature, the circuit will change from its un-tripped to its tripped condition. This change is detected at the output, and correlated with the value of the current at the trip point. The design of resistor 28 must insure that its initial value is below the design center value over the expected range of manufacturing variation. As a result, the test current value will exceed the current calculated for the nominal case when the circuit trips. Resistor 28 should be trimmed so as to increase its value and subsequent sweeps of the test current will show a reduction in the current at the trip threshold. Resistor 28 is trimmed while the test current is repeatedly swept from high to low, until the current at the trip point corresponds to the nominal value corresponding to the set point chosen as the trim temperature.

If an alternative trim technology is available, which permits resistor 28 to be trimmed from a high resistance to low resistance condition, thc external current can simply be set to the design center value, and the resistor trimmed until the circuit trips.

Either procedure will normalize the value of resistor 28 at a value consistent with the predetermined choice of external resistor 42. This will be the nominal or design center value automatically offset to correct for small errors or manufacturing variations in N or the ratio of $I_1$ to $I_2$.

An approximate formula for resistance 30 as a function of temperature is of the form:

$$R_{30}=A/(T_s 30\ T_o)-B$$

where $R_{30}$ is the value of resistor 30 required to cause the circuit 10 to trip at temperature $T_s$, and A, B, and $T_o$ are constants depending on the details of the design of the circuit, and the transistor parameters. Typical values for these constants might be:

A=3.893e+07 Ohm*Degrees

B=65603 Ohms $T_0$=281.5 Degree C

For a given wafer fabrication process, the manufacturing variability from lot to lot will affect mainly the value of B, leaving A and $T_o$ largely invariant. In order to make the user adjustable part of resistor 30 the same in the face of manufacturing variability, part of resistor 30 is made trimmable on the IC. The variation in B from lot to lot is corrected for with trim resistor 40, leaving the user adjustable resistor 42 a function of temperature which is largely independent of manufacturing variation in the transistors or resistor sheet resistance on the IC.

If the resistance of resistor is 30 less than that given by the formula above, the circuit will not trip at temperature $T_o$. Therefore, if resistor 40 is made so that it is reliably smaller than the nominal value, by an amount sufficient to cover all manufacturing variability, the total resistance of resistor 40 will be below the value of the formula, when resistor 42 is made to correspond to $T_s$. Subsequent trimming of resistor 40 to increase its value will increase the total, so that the circuit will trip. If trimming is halted at this point, the circuit will be correctly trimmed for all values of resistor 42 calculated from the formula and allowing for the nominal value of resistor 40 internally.

The test resistor used as resistor 42 can be selected for the anticipated trim temperature, adjusted to fit the actual trim temperature as measured, or electronically emulated as a function of trim temperature.

Resistor technology which permits trimming downward in value can also be accommodated by alternating test values of resistor 42 between the calculated value, and smaller values while trimming proceeds.

Various methods of accomplishing the trimming will occur to those skilled in the art. The circuit is so arranged that the two resistors can be trimmed with little or no interaction to permit normalization of the manufacturing variability so that a single formula can be employed by users to calculate the proper resistance to achieve a desired temperature set point.

Figure 3:
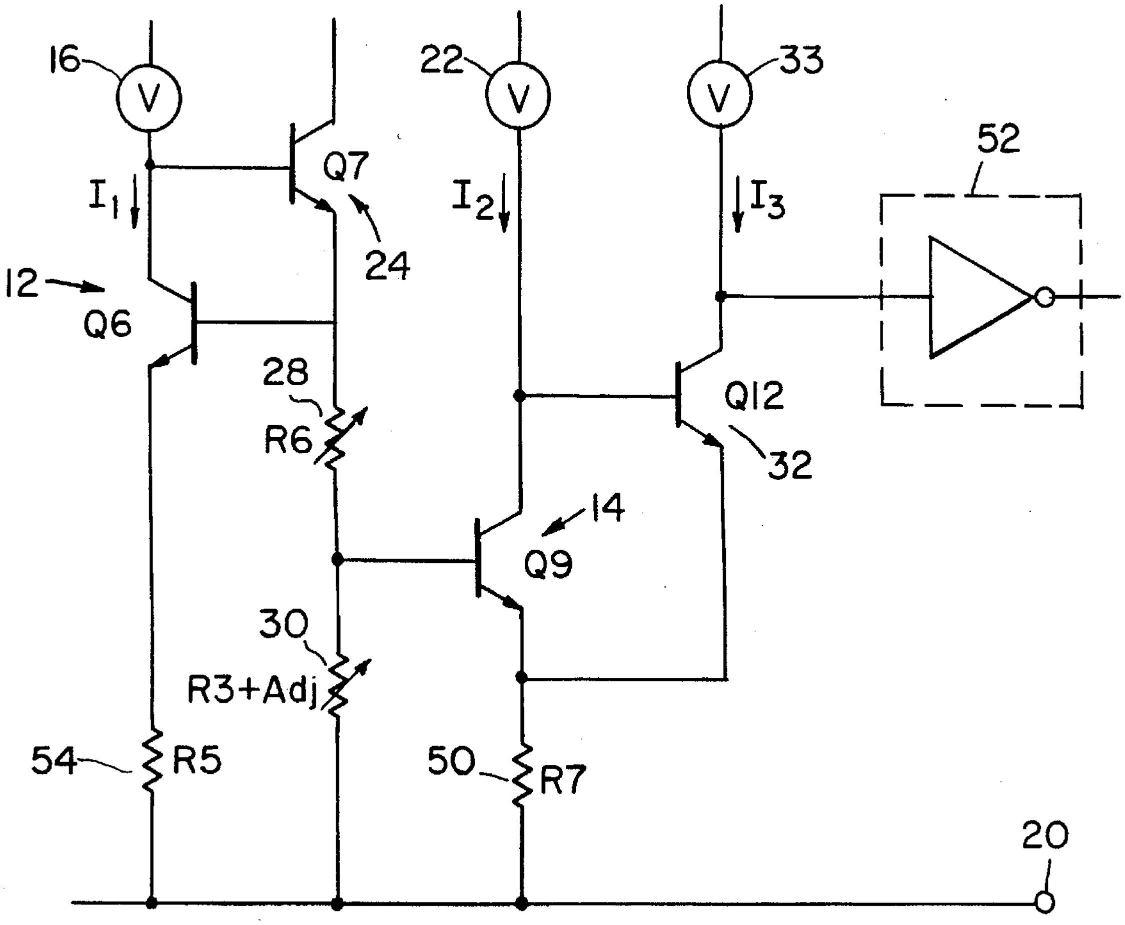
FIG. 3 is a more detailed schematic diagram of a portion of the resistor programmable temperature switch of FIG. 1 showing an output buffer and hysteresis components.

In order to obtain quicker and more abrupt transition for a sharp transition at the temperature set point, a hysteresis resistance 50, FIG. 3, may be introduced as a means to interconnect the emitter of transistor 14 and the emitter of transistor 32 to the common terminal 20. This establishes positive feedback coupling between transistors 32 and 14 so that the state of the collector of transistor 32 switches cleanly and abruptly and provides an output virtually immune to noise proximate the temperature set point. The collector of transistor 32 is connected to a third current source 33. An output inverter buffer 52 is also shown in FIG. 3, as is an additional bias resistor 54 interconnecting the emitter of transistor 12 to the common terminal 20 for offsetting the emitter voltage of transistor 12.

Figure 4:
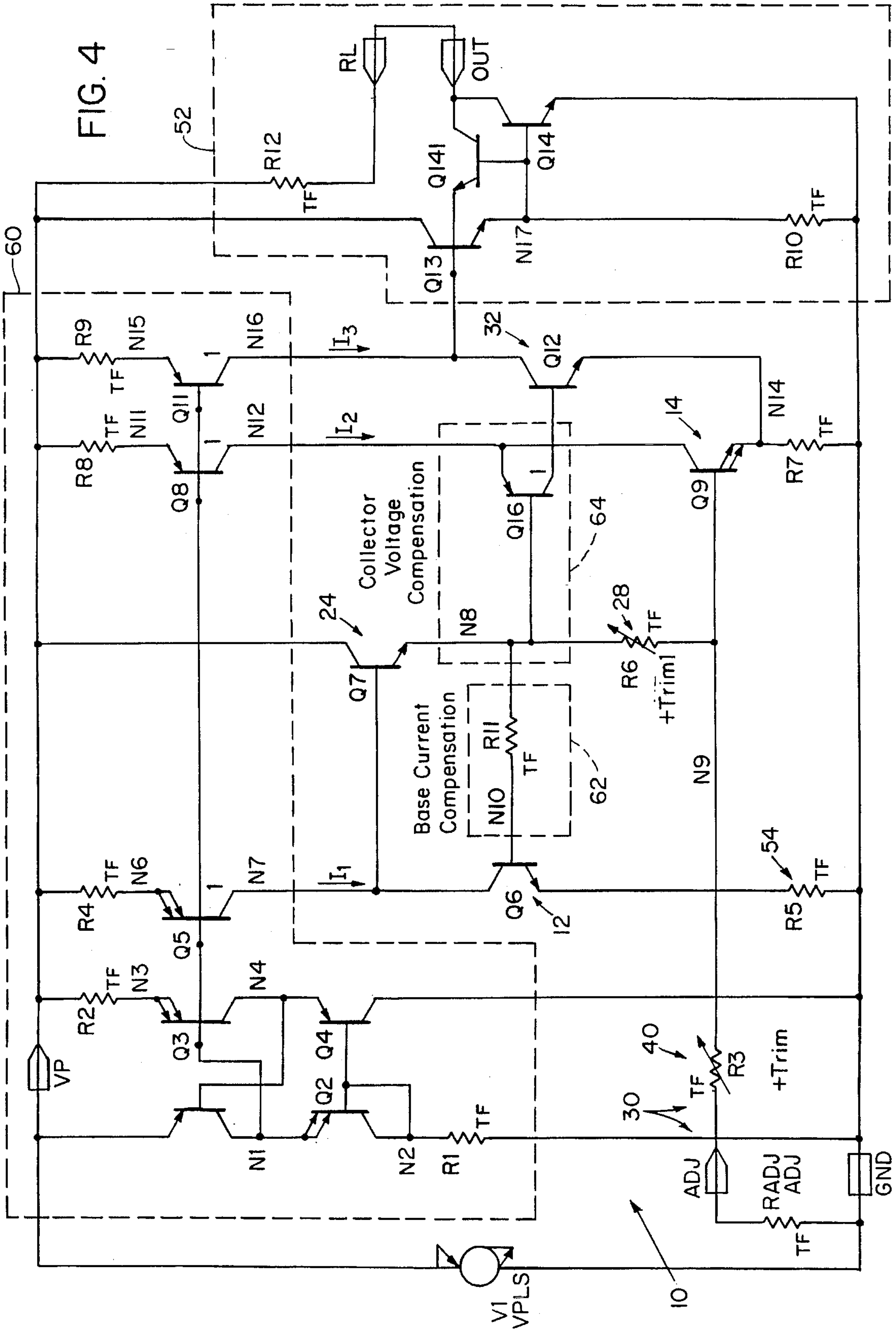
FIG. 4 is a more comprehensive schematic diagram showing the resistor programmable temperature switch of FIG. 1 along with a current source compensator circuits and a more detailed depiction of the output buffer of FIG. 3.

In one construction, the resistor programmable temperature switch 10 according to this invention employs current source 60 which includes sources 16, 22 and 33 to provide currents $I_1$, $I_2$ and $I_3$, FIG. 4. Also shown in FIG. 4 are a base current compensation circuit 62, a collator voltage compensation circuit 64, and a more detailed schematic of output inverter buffer 52. An advantage of programmable temperature switch 10 according to this invention is that it can be trimmed at a single temperature so that its set point temperature is programmable over a wide range using a single resistor derived from a predetermined formula.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A resistor programmable temperature switch for indicating that a preselected trip temperature has been reached, comprising:

first and second bipolar transistors of like polarity having a fixed ratio of emitter areas; means for connecting the emitters of said first and second transistors to a common terminal;

first and second current sources for providing first and second predetermined currents to the collectors of said first and second transistors, respectively;

a third transistor having means for connecting its control terminal to said first current source and a first load terminal connected to the base of said first transistor for operating said first transistor to conduct said first predetermined current from said current source; means for interconnecting a second load terminal of said third transistor with a power supply terminal;

a resistor network including first and second resistors connected between the base of said first transistor and said common terminal for biasing the base of said second transistor to a fraction of the base emitter voltage of said first transistor;

a fourth transistor having means for connecting a first load terminal of said fourth transistor to said common terminal and means for connecting the control terminal of said fourth transistor to said second current source; the load current of said fourth transistor changing state when the preselected trip temperature has been reached.

2. The resistor programmable temperature switch of claim 1 in which said first resistor includes a first trimmable resistance for correcting for sheet resistance errors and current density errors incurred in manufacturing of said first and second transistors.

3. The resistor programmable temperature switch of claim 1 in which said second resistor includes a second trimmable resistance for correcting for sheet resistance errors in said second trimmable resistance and for compensating for manufacturing variations in the base-emitter voltages of said first and second transistors.

4. The resistor programmable temperature switch of claims 2 or 3 in which said second resistor includes an adjustable resistance for setting a preselected trip temperature independent of manufacturing variations.

5. The resistor programmable temperature switch of claim 1 further including a third current source for supplying a predetermined current to said fourth transistor, said means for connecting a load terminal of said fourth transistor to said common terminal including feedback resistor means for interconnecting both said load terminal of said fourth transistor and said emitter of said second transistor to said common terminal for providing positive feedback for abruptly changing the state of said second transistor and for providing noise immunity.

6. The resistor programmable temperature switch of claim 5 further including a bias resistor interconnecting the emitter of said first transistor to said common terminal for offsetting the emitter voltage of said first transistor.

* * * * *